(12) United States Patent
Suzuki

(10) Patent No.: US 6,342,814 B1
(45) Date of Patent: Jan. 29, 2002

(54) OPERATIONAL AMPLIFIER

(75) Inventor: Koji Suzuki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/574,109

(22) Filed: May 19, 2000

(30) Foreign Application Priority Data

Aug. 10, 1999 (JP) ............................................. 11-225977

(51) Int. Cl.[7] ................................................. H03F 3/45
(52) U.S. Cl. ........................................ 330/255; 330/253
(58) Field of Search ................................. 330/255, 264, 330/263, 267, 269, 273, 253

(56) References Cited

U.S. PATENT DOCUMENTS

| | | | | |
|---|---|---|---|---|
| 5,285,168 A | * | 2/1994 | Tomatsu et al. | 330/253 |
| 5,886,578 A | * | 3/1999 | Miyashita et al. | 330/253 |
| 5,900,780 A | * | 5/1999 | Hirose et al. | 330/255 |
| 6,104,248 A | * | 8/2000 | Carver | 330/263 |
| 6,150,853 A | * | 11/2000 | Chrappan et al. | 327/108 |

* cited by examiner

*Primary Examiner*—Robert Pascal
*Assistant Examiner*—Khanh V. Nguyen
(74) *Attorney, Agent, or Firm*—Venable; Robert J. Frank; Allen Wood

(57) ABSTRACT

An operational amplifier includes: a differential input section for generating a first signal corresponding to a differential voltage between two input signals; an amplifying section for amplifying the first signal in voltage to generate second and third complementary signals; a first MOS transistor connected between a first supply voltage and an output node, a conduction state of the first MOS transistor being controlled in accordance with the second signal; a second MOS transistor connected between a second supply voltage and the output node, a conduction state of the second MOS transistor being controlled in accordance with the third signal; and a step-up section for stepping up the first and second supply voltages to generate a step-up voltage higher than the first and second supply voltages; wherein the amplifying section is driven by the step-up voltage so that absolute value of the maximum level of the second or third signal becomes larger than the absolute value of the first or second supply voltage.

6 Claims, 8 Drawing Sheets

US 6,342,814 B1

OPERATIONAL AMPLIFIER

BACKGROUND OF THE INVENTION

1. Field of the Invention

The present invention relates to an operational amplifier, and more articularly to an operational amplifier that is composed of MOS transistors and capable of obtaining a relatively large output current with a low voltage.

2. Description of the Related Art

FIG. 2 is a structural diagram showing an example of a conventional operational amplifier.

The operational amplifier is composed of a differential input section 10 that amplifies a differential voltage between two input signals inputted to an inverting or inverse input terminal 1 and to a non-inveiting or uninverse input teminal 2, an amplifying section 20Z that amplifies an output signal from the differential input section 10, an output section 30Z that outputs a signal amplified by the amplifying section 20Z to an output terminal 3 with a low output impedance, and a bias generating section 40 that generates a bias voltage necessary for the respective sections.

The differential input section 10 includes a p-channel MOS transistor 11, and a source thereof is connected to a supply voltage VDD. A bias voltage VB1 is applied to a gate of the p-channel MOS transistor 11 from the bias generating section 40. A drain of the p-channel MOS transistor 11 is connected with sources of p-channel MOS transistors 12 and 13, respectively, and gates of those p-channel MOS transistors 12 and 13 are connected to the inverse input terminal 1 and the uninverse input terminal 2, respectively. The drain of the p-channel MOS transistor 12 is connected to a drain and a gate of an n-channel MOS transistor 14 as well as a gate of an n-channel MOS transistor 15, respectively. Sources of the n-channel MOS transistors 14 and 15 are grounded to a ground voltage GND. Drains of the p-channel MOS transistor 13 and the n-channel MOS transistor 15 are connected to a node N1, respectively, and a signal V1 is outputted to the node N1 from the differential input section 10.

The amplifying section 20Z includes a p-channel MOS transistor 26, and the supply voltage VDD is applied to a source of the p-channel MOS transistor 26. The bias voltage VB1 is applied to a gate of the p-channel MOS transistor 26 from the bias generating section 40. A drain of the p-channel MOS transistor 26 is connected to a node N2 which is connected with sources of an n-channel MOS transistor 27 and a p-channel MOS transistor 28, respectively. Bias voltages VB2 and VB3 are applied to gates of the n-channel MOS transistor 27 and the p-channel MOS transistor 28 from the bias generating section 40, respectively. Drains of the n-channel MOS transistor 27 and the p-channel MOS transistor 28 are connected to the node N3, respectively, and the node N3 is connected with a drain of an n-channel MOS transistor 29. A gate of the n-channel MOS transistor 29 is connected to the node N1, and a source of the n-channel MOS transistor 29 is grounded to the ground voltage GND.

The output section 30Z is composed of a p-channel MOS transistor 38 and an n-channel MOS transistor 39, and a source, a gate and a drain of the p-channel MOS transistor 38 are connected to the supply voltage VDD, the node N2 and the output terminal 3, respectively. A drain, a gate and a source of the n-channel MOS transistor 39 are connected to the output terminal 3, the node N3 and the ground voltage GND, respectively.

In the operational amplifier thus structured, the differential voltage between an input signal VI1 supplied to the inverse input terminal 1 and an input signal VI2 supplied to the uninverse input terminal 2 is amplified by the differential input section 10 and then outputted to the node N1 as the signal V1. The signal V1 is amplified by the amplifying section 20Z and then supplied to the gate of the n-channel MOS transistor 39 in the output section 30Z from the node N3. Also, a signal that permits a given output current to flow in the output section 30Z is supplied to the gate of the PMOS 38 in the output section 30Z.

With the above structure, the differential voltage between the input signals VI1 and VI2 is amplified and an output voltage VO is outputted from the output terminal 3.

However, the conventional operational amplifier thus structured by the MOS transistors suffers from problems stated below.

FIG. 3 is a graph showing an example of the characteristic of the MOS transistor.

In FIG. 3, assuming that the supply voltage VDD is 2 V, a relation of a voltage Vgs between the gate and the source of the n-channel MOS transistor 39 in the output section 30Z and a drain current Id thereof is represented with the gate width W of the MOS transistor as a parameter. In this example, the gate length L is set to 1 μm.

As shown in FIG. 3, if the voltage Vgs between the gate and the source of the n-channel MOS transistor 39 is held constant, it is necessary to widen the gate width W in order to obtain a large drain current Id. Also, it is apparent from the graph that the larger the voltage Vgs between the gate and the source is, the narrower the gate width W necessary for obtaining a given drain current Id.

In order that the operational amplifier structured as shown in FIG. 2 is operated with a low supply voltage VDD such as 3 V to obtain a large output current such as 200 mA, each of the gate widths W of the p-channel MOS transistor 38 and the n-channel MOS transistor 39 in the output section 30Z is required to be set to about 3 mm. For that reason, the size of the MOS transistors 38 and 39 in the output section 30Z becomes extremely large, resulting in such a problem that a pattern area serving as the integrated circuit increases.

SUMMARY OF THE INVENTION

The present invention has been made to solve the problem inherent in the conventional operational amplifier, and therefore an object of the present invention is to provide an operational amplifier which is capable of obtaining a large output current with a relatively small pattern area even if the supply voltage VDD is low.

In order to achieve the above object, according to the present invention, there is provided an operational amplifier comprising: a differential input section for generating a first signal corresponding to a differential voltage between two input signals; an amplifying section for amplifying the first signal in voltage to generate second and third complementary signals; a first MOS transistor connected between a first supply voltage and an output node, a conduction state of the first MOS transistor being controlled in accordance with the second signal; a second MOS transistor connected between a second supply voltage and the output node, a conduction state of the second MOS transistor being controlled in accordance with the third signal; and a step-up section for stepping up the first and second supply voltages to generate a step-up voltage higher than the first and second supply voltages; wherein the amplifying section is driven by the step-up voltage so that an absolute value of the maximum level of the second or third signal becomes larger than the absolute value of the first or second supply voltage.

According to the present invention, the operational amplifier thus structured operates as follows:

In the step-up section, a step-up voltage higher than the first and second supply voltage is generated and applied to the amplifying section. In the amplifying section driven by the step-up voltage, the first signal supplied from the differential input section is amplified in voltage to generate the second and third complementary signals such that the absolute values of the maximum levels of those second and third complementary signals become larger than the absolute value of the first or second supply voltage. The second signal is supplied to the first MOS transistor so as to control the conduction state of the first MOS transistor. On the other hand, the third signal is supplied to the second MOS transistor so as to control the conduction state of the second MOS transistor. Then, the output current corresponding to the differential voltage between two input signals is outputted from the output node.

BRIEF DESCRIPTION OF THE DRAWINGS

These and other objects, features and advantages of this invention will become more fully apparent from the following detailed description when taken in conjunction with the accompanying drawings in which.

DETAILED DESCRIPTION OF THE PREFERRED EMBODIMENTS

Now, a description will be given in more detail of preferred embodiments of the present invention with reference to the accompanying drawings.
(First Embodiment)

Figure 1:
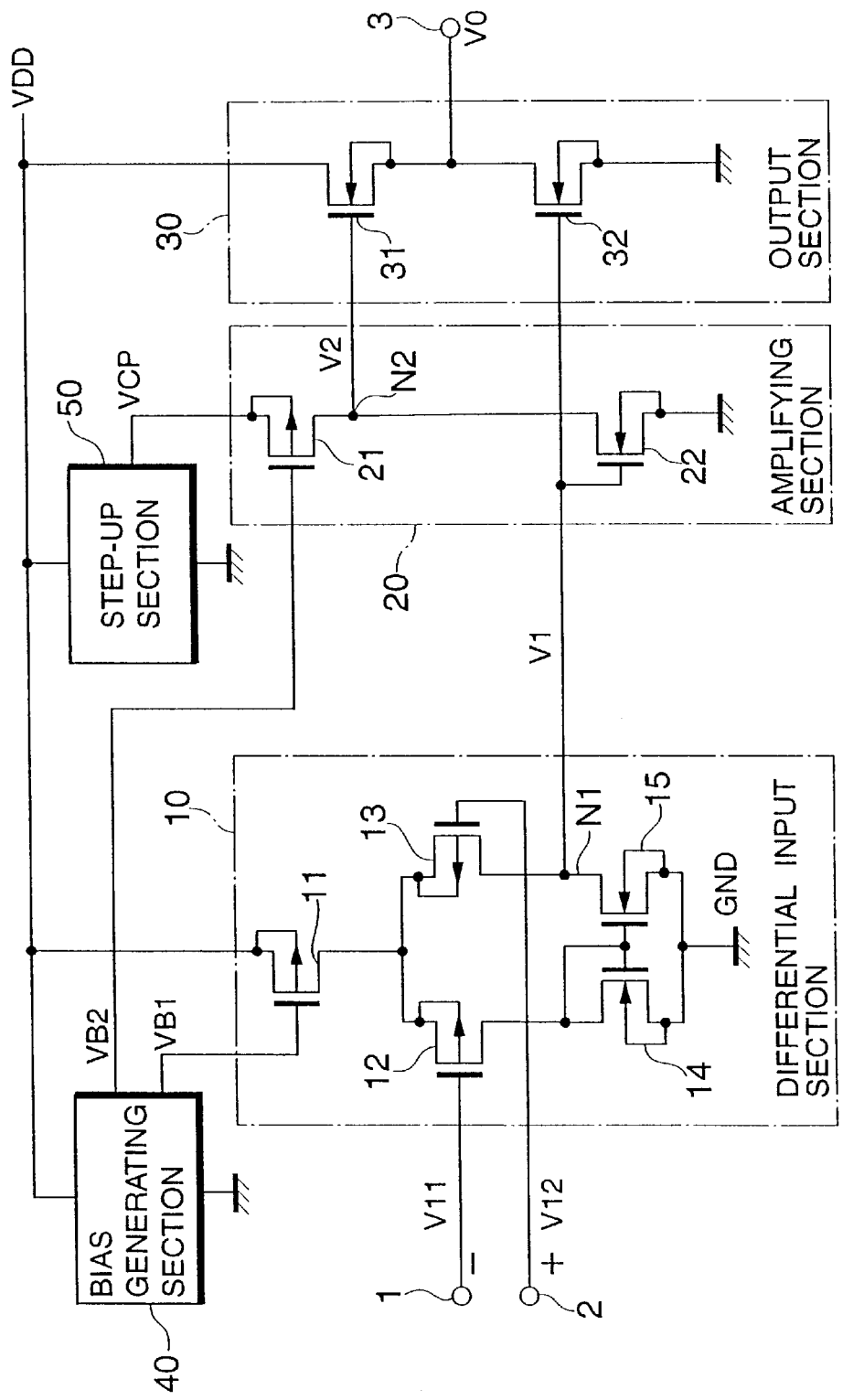
FIG. 1 is a structural diagram showing an operational amplifier in accordance with a first embodiment of the present invention.

FIG. 1 is a structural diagram showing an operational amplifier in accordance with a first embodiment of the present invention.

The operational amplifier is made up of a differential input section 10 that amplifies a differential voltage between two input signals inputted to an inverting or inverse input terminal 1 and to a non-inverting or uninverse input terminal 2, an amplifying section 20 that amplifies an output signal from the differential input section 10, an output section 30 that outputs a signal amplified by the amplifying section 20 to an output terminal 3 with a low output impedance, a bias generating section 40 that generates a bias voltage necessary for the respective sections, and a step-up section 50 that steps up a supply voltage VDD to generate a step-up voltage VCP two to four times as large as the supply voltage VDD.

The differential input section 10 includes a p-channel MOS transistor 11, and a source thereof is connected to a supply voltage VDD. A bias voltage VB1 is applied to a gate of the p-channel MOS transistor 11 from the bias generating section 40. A drain of the p-channel MOS transistor 11 is connected with sources of p-channel MOS transistors 12 and 13, respectively, and gates of those p-channel MOS transistors 12 and 13 are connected to the inverse input terminal 1 and the uninverse input terminal 2, respectively. The drain of the p-channel MOS transistor 12 is connected to a drain and a gate of an n-channel MOS transistor 14 as well as a gate of an n-channel MOS transistor 15, respectively. Sources of the n-channel MOS transistors 14 and 15 are grounded to a ground voltage GND. Drains of the p-channel MOS transistor 13 and the n-channel MOS transistor 15 are connected to a node N1, respectively, and a signal V1 is outputted to the node N1 from the differential input section 10.

The amplifying section 20 includes a p-channel MOS transistor 21 and an n-channel MOS transistor 22. A step-up voltage VCP is applied to a source of the p-channel MOS transistor 21 from the step-up section 50, and a bias voltage VB2 is applied to a gate of the p-channel MOS transistor 21 from the bias generating section 40, respectively. A drain of the p-channel MOS transistor 21 is connected to a node N2 which is connected with a drain of the n-channel MOS transistor 22. A source of the n-channel MOS transistor 22 is grounded to the ground voltage GND, and a gate of the n-channel MOS transistor 22 is supplied with the signal V1 of the differential input section 10.

The output section 30 includes n-channel MOS transistors 31 and 32. A source of the n-clhannel MOS transistor 31 is connected to the supply voltage VDD, a gate of the n-channel MOS transistor 31 is connected to the node N2, and a drain of the n-channel MOS transistor 31 is connected to the output terminal 3, respectively. A drain of the n-channel MOS transistor 32 is connected to the output terminal 3, a gate of the n-channel MOS transistor 32 is connected to the node N1, and a source of the n-channel MOS transistor 32 is grounded to the ground voltage GND, respectively.

Figure 4:
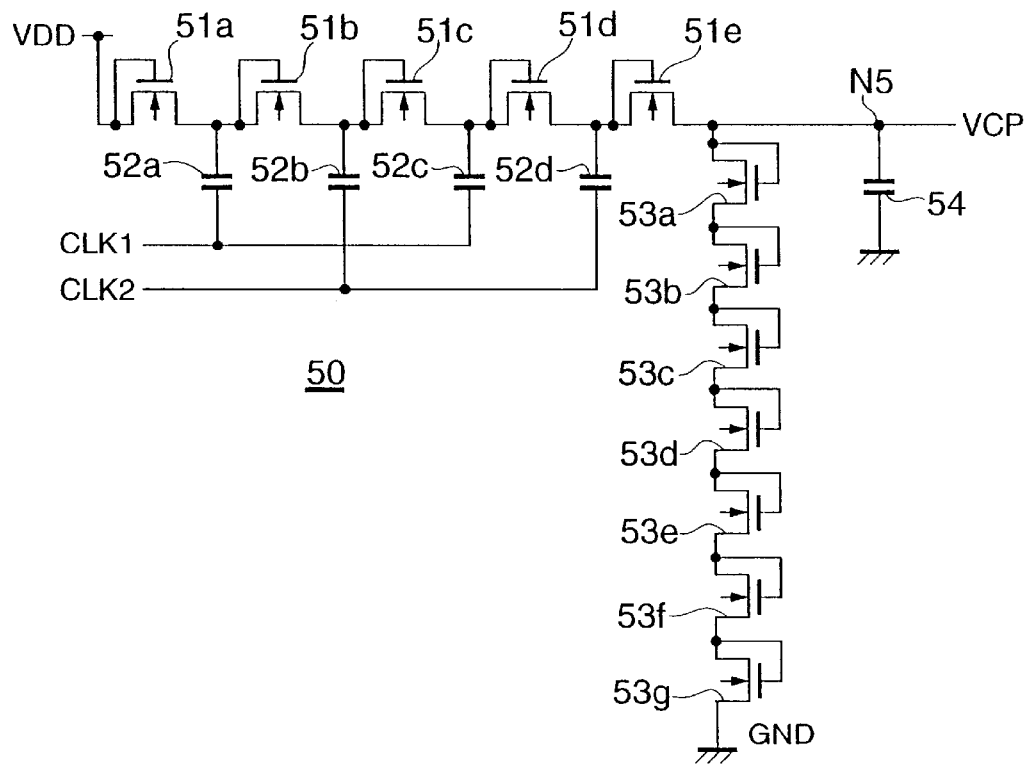
FIG. 4 is a circuit diagram showing an example of a step-up section shown in FIG. 1.

FIG. 4 is a circuit diagram showing an example of the step-up section 50 shown in FIG. 1.

The step-up section 50 includes a plurality of n-channel MOS transistors 51a, 51b, . . . , 51e connected in series to each other in a diode connection manner. A source of the foremost n-channel MOS transistor 51a is connected to the supply voltage VDD, and a drain of the final n-channel MOS transistor 51e is connected to a node N5, respectively. A node of the n-channel MOS transistors 51a and 51b and a node of the n-channel MOS transistors 5c and 51d are supplied with a clock signal CLK1 through capacitors 52a and 52c, respectively. Also, a node of the n-channel MOS transistors 51b and 51c and a node of the n-channel MOS transistors 51d and 51e are supplied with a clock signal CLK2 through capacitors 52b and 52d, respectively. The clock signals CLK1 and CLK2 are, for example, signals which are 20 MHz in frequency and different from each other in phase by 180°. Between the node N5 and the ground voltage GND, a plurality of n-channel MOS transistors 53a, 53b, . . . , 53g are connected in series to each other in a diode connection manner and a capacitor 54 is also connected thereto.

When the clock signals CLK1 and CLK2 are supplied to the step-up section 50 thus structured, a d.c. voltage several times as large as the supply voltage VDD is generated by a voltage doubler rectifier circuit made up of the n-channel MOS transistors 51a to 51e with diode connection and the capacitors 52a to 52d, and then stored in the capacitor 54 connected to the node N5. On the other hand, the n-channel MOS transistors 53a to 53g with diode connection are so adapted as to clamp a voltage at the node N5 to a given voltage whereby a given step-up voltage VCP is outputted from the node N5.

Since a current necessary for the amplifying section 20 is extremely small, the gate widths W of the n-channel MOS transistors 51a to 51e are each set to about 10 μm, and the gate lengths thereof are each set to about 1μm. The gate widths W of the n-channel MOS transistors 53a to 53g are each set to about 50 μm, and the gate lengths thereof are each set to about 1 μm. The capacitances of the capacitors 52a to 52d are each set to about 0.2 pF.

Figure 5:
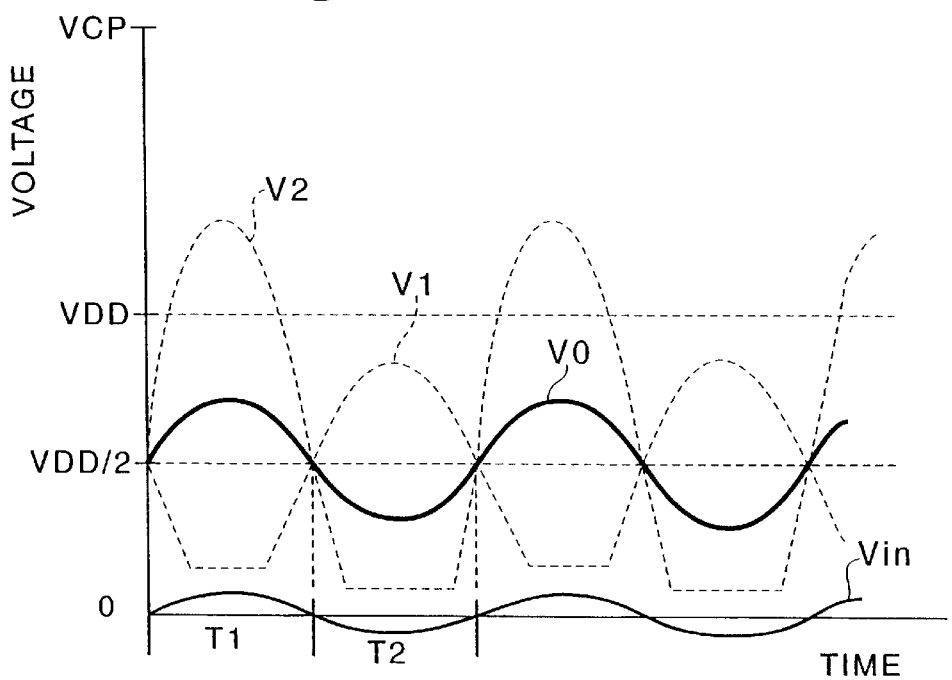
FIG. 5 is a graph showing the operation waveform of the operational amplifier shown in FIG. 1.

FIG. 5 is a graph showing the operation waveform of the operational amplifier shown in FIG. 1.

Hereinafter, the operation of the operational amplifier shown in FIG. 1 will be described with reference to FIG. 5.

Input signals VI1 and VI2 having voltages centering at ½ of the supply voltage VDD are inputted to the inverse input terminal 1 and the uninverse input terminal 2 of the operational amplifier, respectively. A load is connected between the output terminal 3 and the supply voltage VDD/2.

An input differential voltage Vin (=VI1–VI2) between the input signals VI1 and VI2 is amplified by the differential input section 10, which outputs the signal V1 to the node N1.

As seen in a term T1 in FIG. 5, when the input differential voltage V1n is positive, the signal V1 becomes equal to or smaller than the supply voltage VDD/2, as a result of which the on-resistance of the n-channel MOS transistor 22 in the amplifying section 20 and of the n-channel MOS transistor 32 in the output section 30 is increased. With an increase in the on-resistance of the n-channel MOS transistor 22, the voltage of the signal V2 outputted to the node N2 through the p-channel MOS transistor 21 is raised. Since the signal V2 is supplied to the gate of the n-channel MOS transistor 31 in the output section 30, the on-resistance of the n-channel MOS transistor 31 is reduced, and the output voltage VO from the output terminal 3 rises in response to the input differential voltage V1n.

Since the step-up voltage VCP (which is twice the supply voltage VDD or more) is supplied to the source of the p-channel MOS transistor 21, the signal V2 can rise to the supply voltage VDD or higher with a rise of the input differential voltage V1n. For that reason, the voltage Vgs between the gate and the source of the n-channel MOS transistor 31 is increased, thereby allowing a larger drain current to flow through the n-chaimel MOS transistor in accordance with the characteristic shown in FIG. 3. The drain current that flows in the nchannel MOS transistor 31 is supplied to a load through the output terminal 3.

On the other hand, since the signal V1 is equal to or larger than the supply voltage VDD/2 when the input differential voltage V1n is negative as seen in a term T2 in FIG. 5, the on-resistance of the n-channel MOS transistor 22 in the amplifying section 20 and of the n-channel MOS transistor 32 in the output section 30 is decreased. With a decrease in the on-resistance of the nchannel MOS transistor 22, the voltage of the signal V2 outputted to the node N2 through the p-channel MOS transistor 21 drops. The signal V2 is supplied to the gate of the n-channel MOS transistor 31 in the output section 30, increasing the on-resistance of the n-channel MOS transistor 31, and reducing the output voltage VO from the output terminal 3 to the supply voltage VDD/2 or less in accordance with the input differential voltage V1n. As a result, a current flows into the n-channel MOS transistor 32 from the load side.

As described above, the operational amplifier according to the first embodiment includes the step-up section 50 that steps up the supply voltage VDD and structures the amplifying section 20 so as to raise the gate voltage of the n-channel MOS transistor 31 up to the step-up voltage VCP. With this structure, a large output current can be obtained even with the n-channel MOS transistor 31 narrow in the gate width W.

Figure 2:
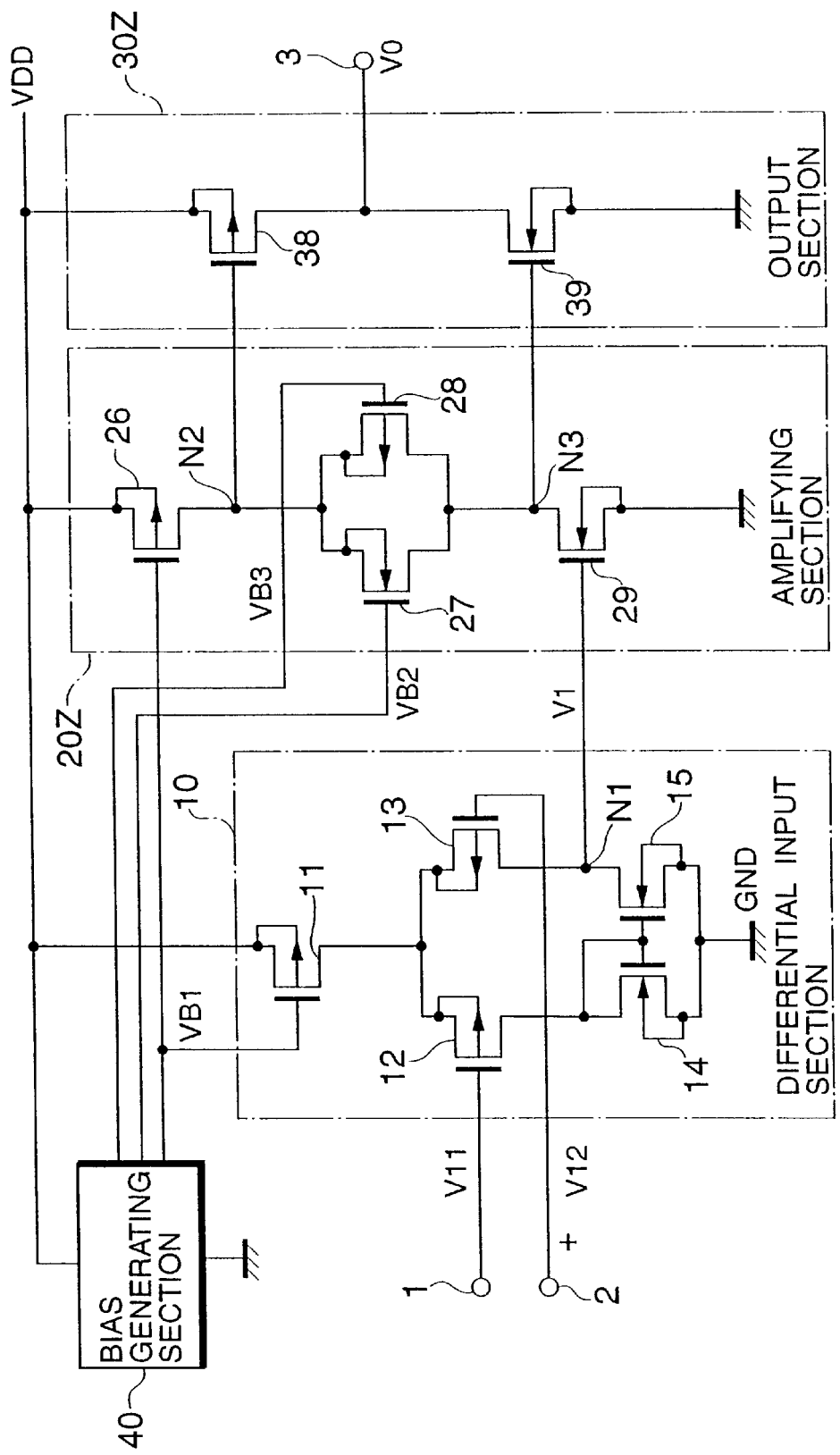
FIG. 2 is a structural diagram showing an example of a conventional operational amplifier.

Now, the gate width W in the pattern of the above operational amplifier will be compared with that of the operational amplifier shown in FIG. 2.

In the operational amplifier shown in FIG. 2, in order to obtain the output current of 200 mA, it is necessary to set each gate width W of the p-channel MOS transistor 38 and the n-channel MOS transistor 39 to about 3 mm. Therefore, the widths W of the output section 30Z are 6 mm in total.

Figure 3:
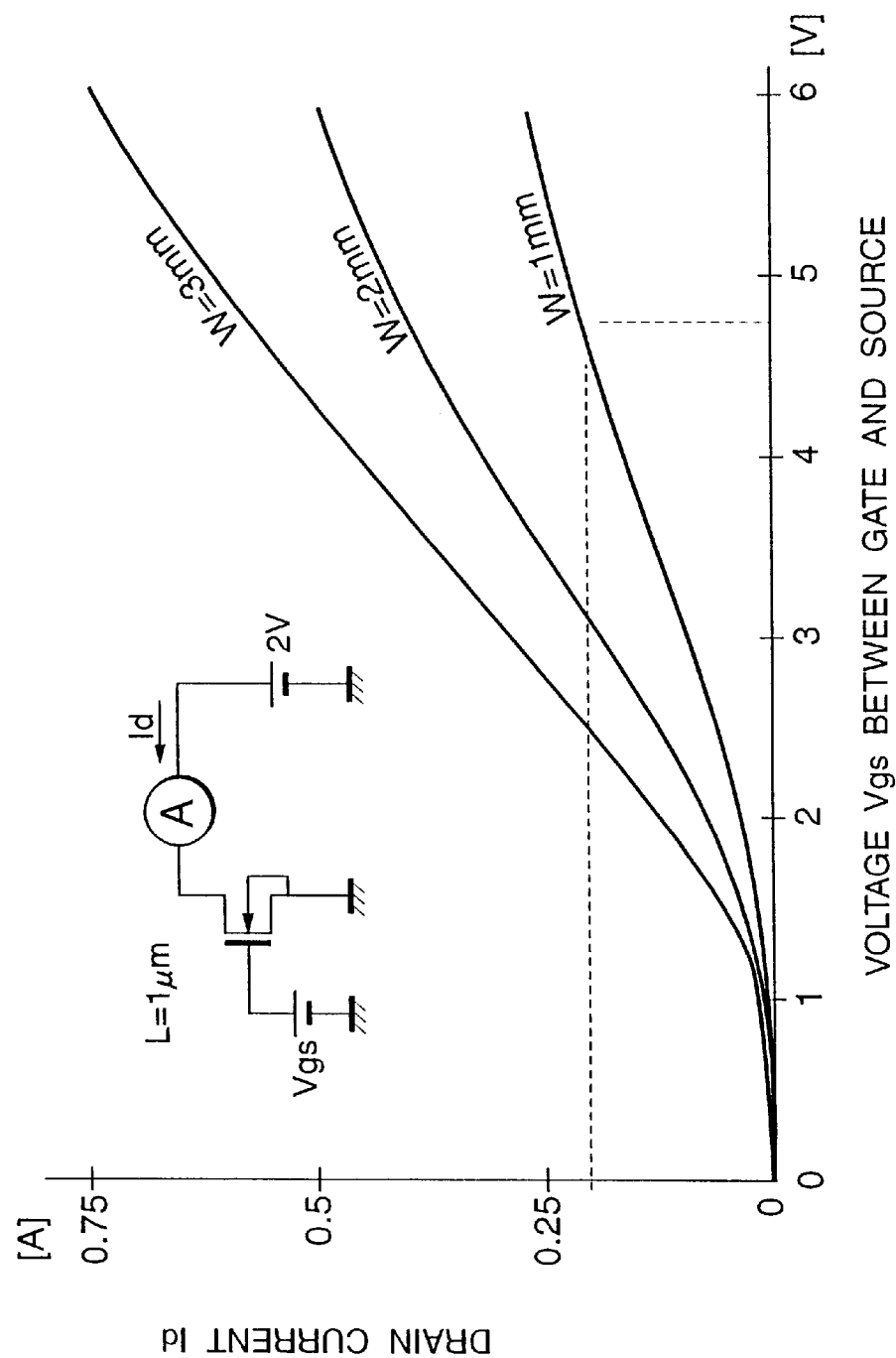
FIG. 3 is a graph showing an example of the characteristic of a MOS transistor.

On the other hand, in the operational amplifier shown in FIG. 1, each gate width W of the n-channel MOS transistors 31 and 32 in the output section 30 for obtaining the same output current is about 1 mm, as is apparent from FIG. 3. Although the step-up section 50 is added into the operational amplifier shown in FIG. 1, as described above, the capacitance of the step-up section 50 is so small that the gate widths W thereof are about 1 mm in total. Accordingly, the gate widths W of the MOS transistors in the output sections 30 and the step-up section 50 in the operational amplifier are 3 mm in total.

As a result, the operational amplifier according to the first embodiment of the present invention has such an advantage that a larger output current can be obtained with a relatively small pattern area even if the supply voltage VDD is low.

(Second Embodiment)

Figure 6:
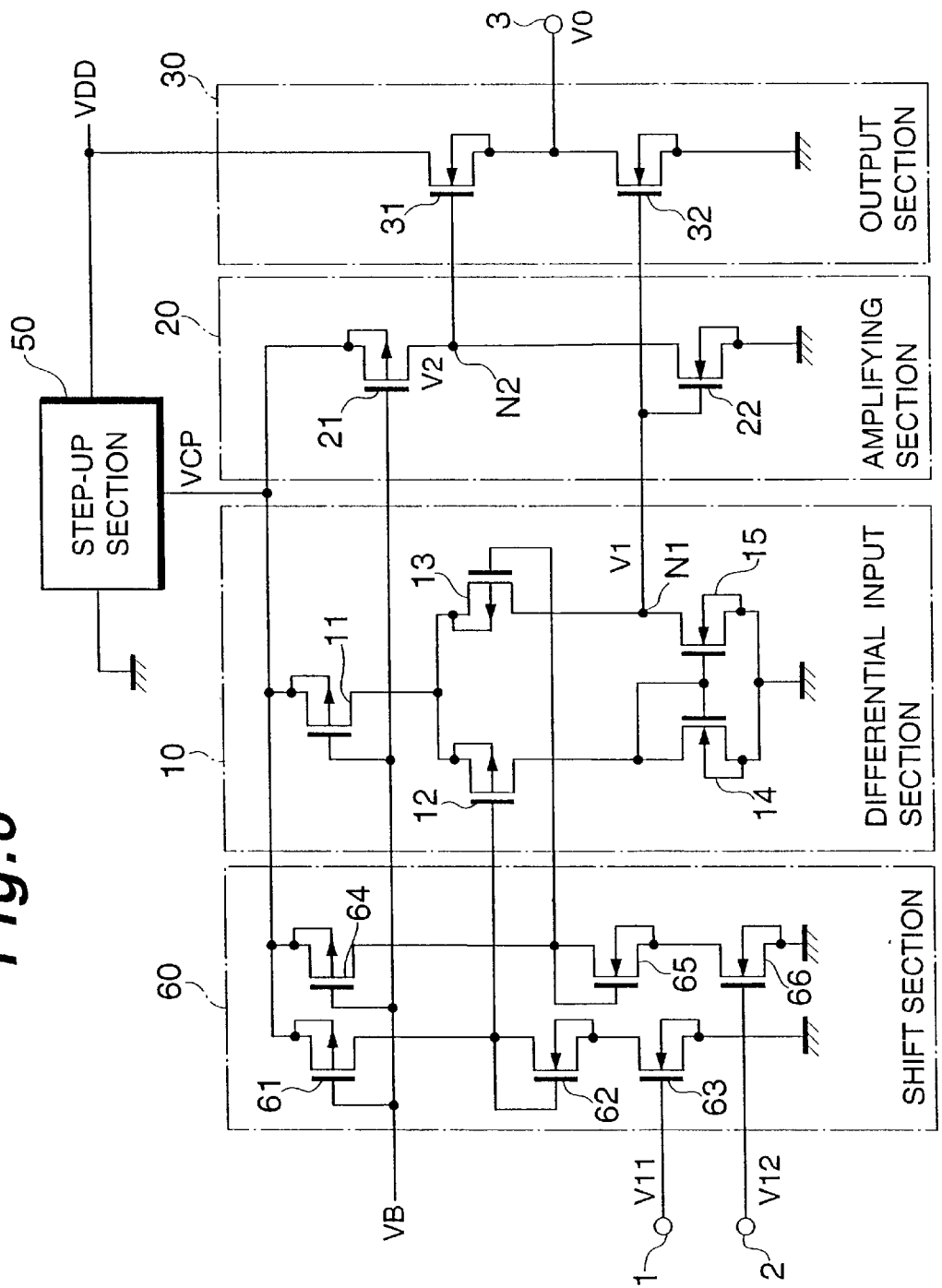
FIG. 6 is a structural diagram showing an operational amplifier in accordance with a second embodiment of the present invention.

FIG. 6 is a structural diagram showing an operational amplifier in accordance with a second embodiment of the present invention, in which the same components as those in FIG. 1 are designated by identical reference symbols.

In the operational amplifier shown in FIG. 6, a shift section 60 for shifting up the input signals VI1 and VI2 by a given voltage is disposed at a pre-stage of the differential input section 10.

The shift section 60 includes a series circuit consisting of a p-channel MOS transistor 61 and n-channel MOS transistors 62, 63 which shift up the input signal VI1, in which a source of the p-channel MOS transistor 61 is connected to the step-up voltage VCP, and a source of the n-channel MOS transistor 63 is grounded to the ground voltage GND. A bias voltage VB is applied to a gate of the p-channel MOS 61, and a gate of the n-channel MOS transistor 63 is connected to the inverse input terminal 1. A gate of the n-channel MOS transistor 62 is connected to drains of the p-channel MOS transistor 61 and the n-channel MOS transistor 62 and also connected to the gate of the p-channel MOS transistor 12 in the differential input section 10.

The shift section 60 includes another series circuit consisting of a p-channel MOS transistor 64 and n-channel MOS transistors 65, 66 which, similar to the series circuit for shifting up the signal VI1, shift up the input signal VI2. A source of the p-channel MOS transistor 64 is connected to the step-up voltage VCP, and a source of the n-channel MOS transistor 66 is grounded to the ground voltage GND. The bias voltage VB is applied to a gate of the p-channel MOS 64, and a gate of the n-channel MOS transistor 66 is connected to the uninverse input terminal 2. A gate of the n-channel MOS transistor 65 is connected to drains of the p-channel MOS transistor 64 and the n-channel MOS transistor 65 and also connected to the gate of the p-channel MOS transistor 13 in the differential input section 10.

The source of the p-channel MOS transistor 11 in the differential input section 10 is connected to the step-up voltage VCP instead of the supply voltage VDD. Other structures are identical with those in FIG. 1.

Figure 7:
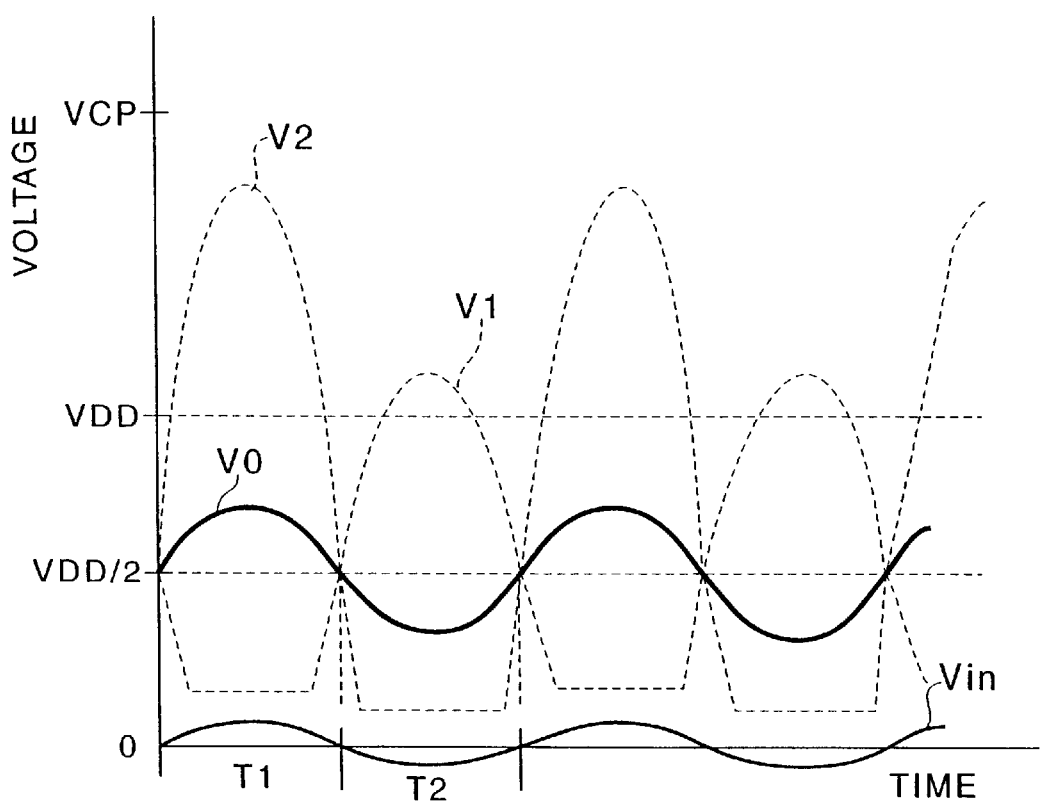
FIG. 7 is a graph showing the operation waveform of the operational amplifier shown in FIG. 6.

FIG. 7 is a graph showing the operation waveform of the operational amplifier shown in FIG. 6.

Hereinafter, the operation of the operational amplifier shown in FIG. 6 will be described with reference to FIG. 7.

Input signals VI1 and VI2 having voltages centering at ½ of the supply voltage VDD are inputted to the inverse input terminal 1 and the uninverse input terminal 2 of the operational amplifier, respectively. A load is connected between the output terminal 3 and the supply voltage VDD/2.

After both of the input signals VI1 and VI2 are shifted up by a given voltage in the shift section 60, they are supplied to and amplified by the differential input section 10. Since the step-up voltage VCP is applied to the differential input section 10 as a power supply, a level of the signal V1 at the node N1 becomes a voltage relatively shifted up.

As seen in term T1 in FIG. 7, when the input differential voltage Vin is positive, the signal V1 is equal to or smaller than the supply voltage VDD/2, as a result of which the on-resistance of the n-channel MOS transistor 22 in the amplifying section 20 and the n-channel MOS transistor 32 in the output section 30 is increased. With an increase in the on-resistance of the n-channel MOS transistor 22, the voltage of the signal V2 outputted to the node N2 through the p-channel MOS transistor 21 is raised. The signal V2 is supplied to the gate of the n-channel MOS transistor 31 in the output section 30, reducing the on-resistance of the n-channel MOS transistor 31, and increasing the output voltage VO from the output terminal 3 rises in response to the input differential voltage Vin.

Since the supply voltage VCP twice the supply voltage VDD or larger is supplied to the source of the p-channel MOS transistor 21, the signal V2 rises to the supply voltage VDD or higher with a rise of the input differential voltage Vin. For that reason, the voltage Vgs between the gate and the source of the n-channel MOS transistor 31 is increased, thereby allowing a larger current to flow through the n-channel MOS transistor 31 in accordance with the characteristic shown in FIG. 3. The current that flows in the n-channel MOS transistor 31 is supplied to a load through the output terminal 3.

On the other hand, since the signal Vl is the supply voltage VDD/2 when the input differential voltage Vin is negative as seen in a term T2 in FIG. 5, the on-resistance of the n-channel MOS transistor 22 in the amplifying section 20 and the n-channel MOS transistor 32 in the output section 30 decrease. With a decrease in the on-resistance of the n-channel MOS transistor 22, the voltage of the signal V2 outputted to the node N2 through the p-channel MOS transistor 21 drops. The signal V2 is supplied to the gate of the n-channel MOS transistor 31 in the output section 30, increasing the on-resistance of the n-channel MOS transistor 31, and reducing the output voltage VO from the output terminal 3 to the supply voltage VDD/2 or less in response to the input differential voltage Vin. The current thus flows into the n-channel MOS transistor 32 from the load side through the output terminal 3. In this situation, since the signal V1 at the node N1 is shifted up, the voltage Vgs between the gate and source of the n-channel MOS transistor 32 is increased with the result that a larger drain current is allowed to flow the n-channel MOS transistor 32 in accordance with the characteristic shown in FIG. 3.

As described above, the operational amplifier according to the second embodiment includes the step-up section 50 that steps up the supply voltage VDD and structures the shift section 60, the differential input section 10 and the amplifying section 20 so as to raise the gate voltages of the n-channel MOS transistors 31 and 32 in the output section 30 up to the step-up voltage VCP. With this structure, the present invention provides an advantage in that a large output current can be obtained even with the n-channel MOS transistors 31 and 32 that are narrow in the gate width W.

(Third Embodiment)

Figure 8:
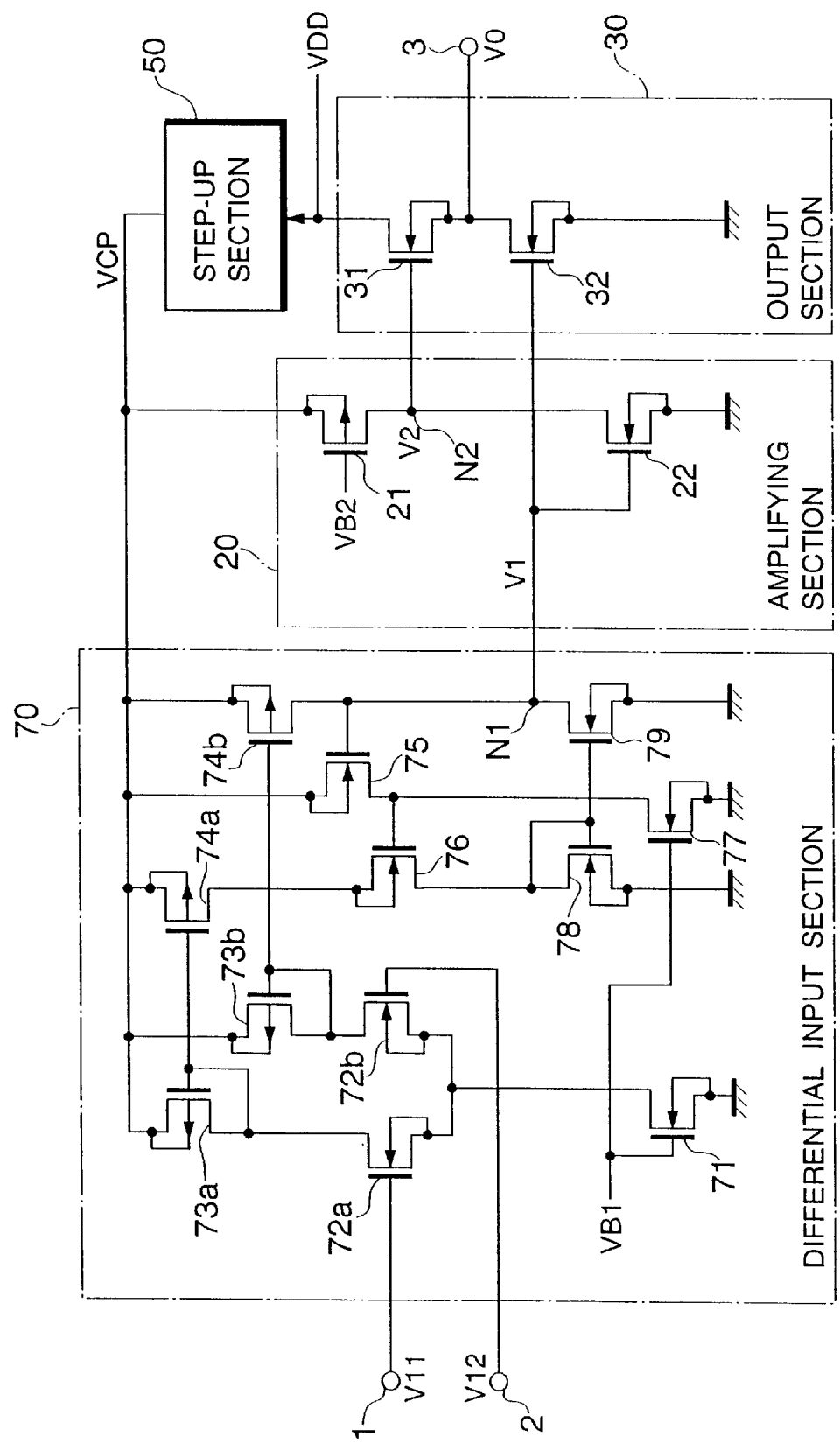
FIG. 8 is a structural diagram showing an operational amplifier in accordance with a third embodiment of the present invention.

FIG. 8 is a structural diagram showing an operational amplifier in accordance with a third embodiment of the present invention, in which the same components as those in FIG. 2 are designated by identical reference symbols.

The operational amplifier shown in FIG. 8 includes a differential amplifying section 70 different in structure from the differential input section 10 shown in FIG. 2 instead of the differential input section 10. The differential input section 70 includes an n-channel MOS transistor 71 a source of which is grounded to the ground voltage GND and a bias voltage VB1 is applied to a gate of the n-channel MOS transistor 71. A drain of the n-channel MOS transistor 71 is connected with sources of n-channel MOS transistors 72a and 72b, and gates of those n-channel MOS transistors 72a and 72b are connected to the inverse input terminal 1 and the uninverse input terminal 2, respectively. Drains of the n-channel MOS transistors 72a and 72b are connected to the step-up voltage VCP through p-channel MOS transistors 73a and 73b, respectively. Those p-channel MOS transistors 73a and 73b are connected with p-channel MOS transistors 74a and 74b which constitute a current mirror circuit, respectively.

A drain of the p-channel MOS transistor 74b is connected to the node N1 that is connected with a gate of an n-channel MOS transistor 75. A source of the n-channel MOS transistor 75 is connected to the step-up voltage VCP, and a drain of the n-channel MOS transistor 75 is connected to a gate of a p-channel MOS transistor 76 and also grounded to the ground voltage GND through an n-channel MOS transistor 77. A source of the p-channel MOS transistor 76 is connected to a drain of the p-channel MOS transistor 74a, and a drain of the p-channel MOS transistor 76 is connected to a drain and a gate of an n-channel MOS transistor 78 as well as a gate of an n-channel MOS transistor 79. A source of the n-channel MOS transistor 78 is grounded to the ground voltage GND. Also, a drain of the n-channel MOS transistor 79 is connected to the node N1, and a source of the n-channel MOS transistor 79 is grounded to the ground voltage GND. Other structures are identical with those in FIG. 2.

The operation of the operational amplifier is basically identical with that of the operation amplifier in FIG. 6.

In the operational amplifier shown in FIG. 8, currents flowing the n-channel MOS transistors 72a and 72b in the differential input section 70 to which the input signals VI1 and VI2 are supplied are returned by the current mirror circuits of the p-channel MOS transistors 73a, 74a and of the p-channel MOS transistors 73b, 74b, respectively. With this structure, the drain voltages of the n-channel MOS transistors 72a and 72b becomes equal to each other. In addition, the current mirror circuits are biased by the n-channel MOS transistor 75 and the p-channel MOS transistor 76 so that the drain voltages of the p-channel MOS transistors 74a and 74b become equal to each other.

The signal V1 from the drain of the p-channel MOS transistor 74b, that is, the node N1 is supplied to the amplifying section 20 and the output section 30. The operation of the amplifying section 20 and the output section 30 is identical with the operation in the operational amplifier shown in FIG. 6.

As described above, the operational amplifier according to the third embodiment is so structured as to make the drain voltages of the n-channel MOS transistors 72a and 72b in the differential amplifying section 70 equal to each other, and hence there is an advantage in that the offset voltage becomes small to reduce an error. In addition, since the currents flowing in the n-channel MOS transistors 72a and 72b are returned by the current mirror circuits of the p-channel MOS transistors 73a, 74a and of the p-channel MOS transistors 73b, 74b, respectively, a range in which the signal V1 of the node N1 fluctuates can be enlarged within the limit of from the ground voltage GND to the step-up voltage VCP. This structure provides an advantage in that a larger output current can be obtained even with the n-channel MOS transistors 31 and 32 narrow in the gate width W.

(Fourth Embodiment)

Figure 9:
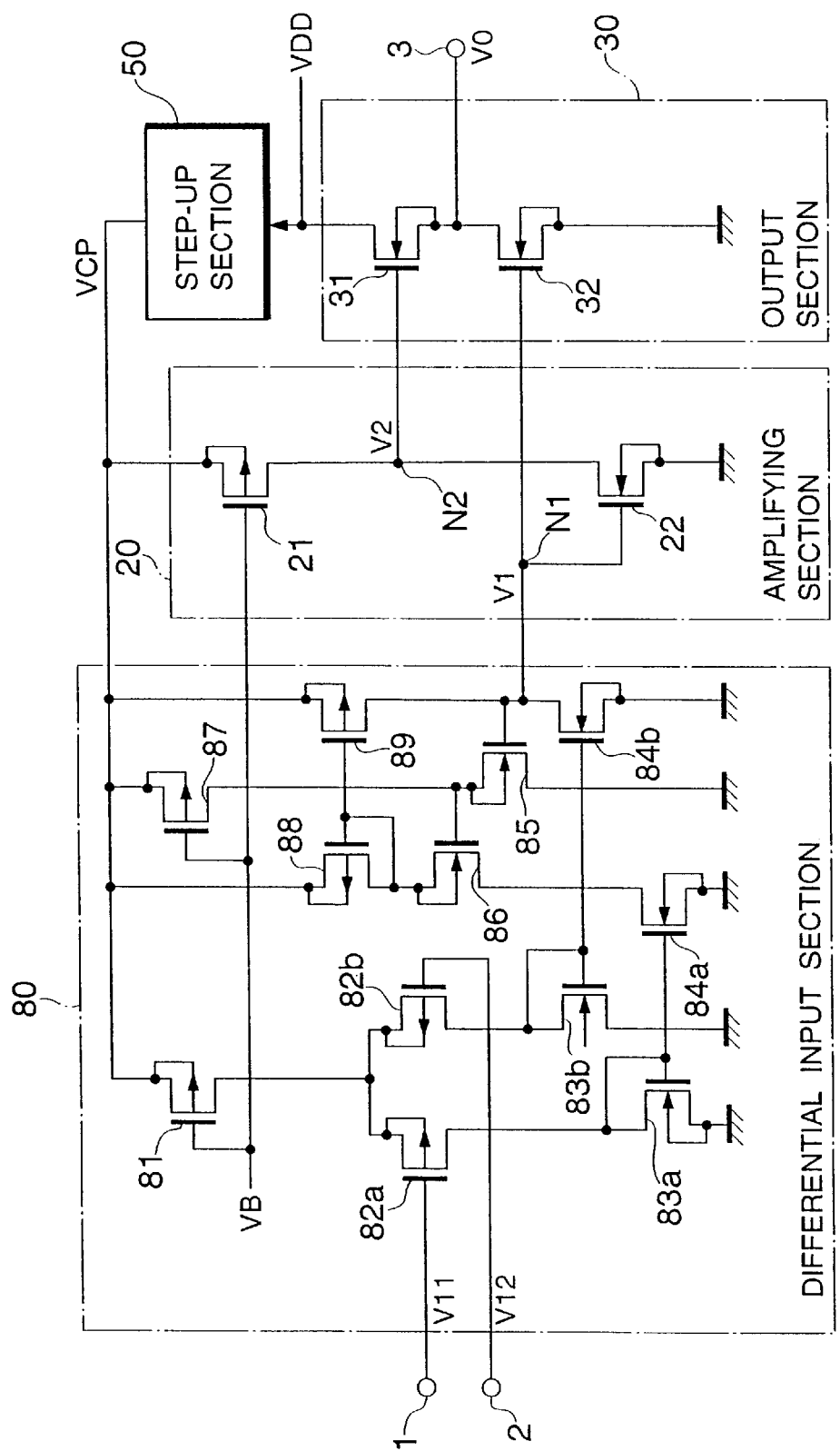
FIG. 9 is a structural diagram showing an operational amplifier in accordance with a fourth embodiment of the present invention.

FIG. 9 is a structural diagram showing an operational amplifier in accordance with a fourth embodiment of the present invention, in which the same components as those in FIG. 8 are designated by identical reference symbols.

The operational amplifier shown in FIG. 9 includes a differential input section 80 different in structure from the differential input section 70 shown in FIG. 8 instead of the differential input section 70. The differential amplifying section 80 includes a p-channel MOS transistor 81. A source of the p-channel MOS transistor 81 is grounded to the step-up voltage VCP and a bias voltage VB1 is applied to a gate of the p-channel MOS transistor 81. A drain of the p-channel MOS transistor 81 is connected with sources of p-channel MOS transistors 82a and 82b, and gates of those p-channel MOS transistors 82a and 82b are connected to the inverse input terminal 1 and the uninverse input terminal 2, respectively. Drains of the p-channel MOS transistors 82a and 82b are grounded to the ground voltage GND through n-channel MOS transistors 83a and 83b, respectively. Those n-channel MOS transistors 83a and 83b are connected with n-channel MOS transistors 84a and 84b which constitute a current mirror circuit, respectively.

A drain of the n-channel MOS transistor 84b is connected to the node N1 that is connected with a gate of a p-channel MOS transistor 85. A source of the p-channel MOS transistor 85 is connected to the ground voltage GND, and a drain of the p-channel MOS transistor 85 is connected to a gate of an n-channel MOS transistor 86 and also connected to the step-up voltage VCP through a p-channel MOS transistor 87. A source of the n-channel MOS transistor 86 is connected to a drain of the n-channel MOS transistor 84a, and a drain of the n-channel MOS transistor 86 is connected to a drain and a gate of a p-channel MOS transistor 88 as well as a gate of a p-channel MOS transistor 89. A source of the p-channel MOS transistor 88 is connected to the step-up voltage VCP. Also, a drain of the p-channel MOS transistor 89 is connected to the node N1, and a source of the p-channel MOS transistor 89 is connected to the step-up voltage VCP. Other structures are identical with those in FIG. 8.

The operation of the operational amplifier is basically identical with that of the operational amplifier of FIG. 8.

In the operational amplifier shown in FIG. 9, currents flowing in the p-channel MOS transistors 82a and 82b in the differential input section 80 to which the input signals VI1 and VI2 are supplied are returned by the current mirror circuits of the n-channel MOS transistors 83a, 84a and of the n-channel MOS transistors 83b, 84b, respectively. With this structure, the drain voltages of the p-channel MOS transistors 82a and 82b become equal to each other. In addition, the current mirror circuits are biased by the p-channel MOS transistor 85 and the n-channel MOS transistor 86 so that the drain voltages of the n-channel MOS transistors 84a and 84b become equal to each other.

The signal V1 from the drain of n-channel MOS transistor 84b, that is, the node N1 is supplied to the amplifying section 20 and the output section 30. The operation of the amplifying section 20 and the output section 30 is identical with the operation in the operational amplifier shown in FIG. 8.

As described above, the operational amplifier according to the fourth embodiment is so structured as to make the drain voltages of the p-channel MOS transistors 82a and 82b in the differential amplifying section 80 equal to each other, and hence there is an advantage in that the offset voltage becomes small to reduce an error. In addition, since the currents flowing in the p-channel MOS transistors 82a and 82b are returned by the current mirror circuits of the n-channel MOS transistors 83a, 84a and the n-channel MOS transistors 83b, 84b, respectively, a range in which the signal V1 of the node N1 fluctuates can be enlarged within the limit of from the ground voltage GND to the step-up voltage VCP. This structure provides an advantage in that a larger output current can be obtained even with the n-channel MOS transistors 31 and 32 narrow in the gate width W.

The present invention is not limited by or to the above-described embodiments but may variously be modified. For example, the following modified examples (a) to (c) are proposed.

(a) The above operational amplifier is of a single power supply type in which the operational amplifier is driven by one supply voltage VDD. However, the present invention may similarly be applied to the two power supply type using two supply voltages one of which is positive and the other is negative. In this case, the step-up section is required to generate positive and negative step-up voltages.

(b) The structure of the step-up section 50 is not limited to the circuit structure shown in FIG. 4. Any circuit structure may be adopted as long as it allows to step-up the supply voltage VDD to generate the step-up voltage VCP several times as large as the supply voltage VDD.

(c) The structures of the differential input section 10, the amplifying section 20, etc. are not limited to the one exemplarily shown in the above, but various kinds of circuit structures that have conventionally been employed can be applied to thereto.

As was described above, according to the present invention, the operation amplifier includes the step-up section that steps up the supply voltage to generate the step-up voltage, and the amplifying section which is driven by the step-up voltage to output the second or the third signal large than the supply voltage. Also, the first and second MOS transistors driven by the supply voltage are controlled using the second and the third signals, respectively. This leads to such an effect that a larger current can be allowed to flow without widening the gate width of the MOS transistor even if the supply voltage is low.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An operational amplifier comprising:

a differential input section for generating a first signal corresponding to a differential voltage between two input signals;

an amplifying section for amplifying the first signal in voltage to generate a second signal;

a first MOS transistor connected between a first supply voltage and an output node, a conduction state of said first MOS transistor being controlled according to the second signal;

a second MOS transistor connected between a second supply voltage and said output node, a conduction state of said second MOS transistor being controlled in accordance with the first signal; and a step-up section to which the first and second supply voltages are applied to generate a step-up voltage higher than the first supply voltage;

wherein said first and second transistors have channels of the same conductivity type, and wherein said amplifying section is driven by the step-up voltage so that the absolute value of the maximum level of the second signal becomes larger than the absolute value of the difference between the first and second supply voltages.

2. The operational amplifier as claimed in claim 1, further comprising a shift section for shifting up the two input signals by a given voltage.

3. The operational amplifier as claimed in claim 1, further comprising a bias generating section for generating a bias voltage necessary for the respective sections.

4. An operational amplifier comprising:

a differential input section for generating a first signal corresponding to a differential voltage between two input signals;

an amplifying section for amplifying the first signal in voltage to generate a second signal;

a first MOS transistor connected between a first supply voltage and an output node, a conduction state of said first MOS transistor being controlled according to the second signal;

a second MOS transistor connected between a second supply voltage and said output node, a conduction state of said second MOS transistor being controlled in accordance with the first signal; and a step-up section to which the first and second supply voltages are applied to generate a step-up voltage higher than the first supply voltage;

wherein said amplifying section is driven by the step-up voltage so that the absolute value of the maximum level of the second signal becomes larger than the absolute value of the difference between first and second supply voltages, and wherein said step-up section comprises a voltage doubler rectifier circuit for generating a d.c. voltage several times as large as the first supply voltage; a capacitor for storing the d.c. voltage; a node connected between said voltage doubler rectifier circuit and said capacitor; and a clamper circuit for clamping a voltage at said node to a given voltage to output a given step-up voltage from said node.

5. The operational amplifier as claimed in claim 4, further comprising a shift section for shifting up the two input signals by a given voltage.

6. The operational amplifier as claimed in claim 4, further comprising a bias generating section for generating a bias voltage necessary for the respective sections.

* * * * *